(12) United States Patent
Zhao et al.

(10) Patent No.: US 8,076,590 B2
(45) Date of Patent: Dec. 13, 2011

(54) PRINTED CIRCUIT BOARD

(75) Inventors: Hui-Chen Zhao, Shenzhen (CN); Qing-Lin Zhou, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 689 days.

(21) Appl. No.: 12/198,343

(22) Filed: Aug. 26, 2008

(65) Prior Publication Data

US 2010/0000777 A1    Jan. 7, 2010

(30) Foreign Application Priority Data

Jul. 3, 2008 (CN) ............ 2008 2 0301432 U

(51) Int. Cl.
*H05K 1/11* (2006.01)
*H05K 1/03* (2006.01)

(52) U.S. Cl. ........ 174/262; 174/255; 174/261; 361/780; 361/794; 257/698

(58) Field of Classification Search .......... 361/760–767, 361/780, 792–795; 174/252–266; 257/738, 257/690–700; 29/846, 852
See application file for complete search history.

(56) References Cited

U.S. PATENT DOCUMENTS

| | | | | |
|---|---|---|---|---|
| 4,298,770 A * | 11/1981 | Nishihara et al. | ............ | 174/262 |
| 4,636,919 A * | 1/1987 | Itakura et al. | ................. | 361/794 |
| 6,255,600 B1 * | 7/2001 | Schaper | ....................... | 174/255 |
| 6,297,460 B1 * | 10/2001 | Schaper | ....................... | 174/261 |
| 6,329,604 B1 * | 12/2001 | Koya | .............................. | 174/255 |
| 6,486,405 B2 * | 11/2002 | Lin | ........................... | 174/113 R |
| 6,559,733 B2 * | 5/2003 | Larson et al. | ............... | 333/22 R |
| 6,897,831 B2 * | 5/2005 | McKinzie et al. | ........... | 343/909 |
| 6,972,380 B2 * | 12/2005 | Lee | ............................. | 174/255 |
| 7,047,628 B2 * | 5/2006 | Lee | ............................... | 29/830 |
| 7,149,092 B2 * | 12/2006 | Iguchi | .......................... | 361/780 |
| 7,230,506 B2 * | 6/2007 | Beale et al. | ....................... | 333/5 |
| 7,372,143 B2 * | 5/2008 | Nakamura et al. | ........... | 257/698 |
| 7,405,473 B1 * | 7/2008 | Shi et al. | ....................... | 257/698 |
| 7,448,909 B2 * | 11/2008 | Regnier et al. | ........... | 439/607.05 |
| 7,459,638 B2 * | 12/2008 | Chen et al. | .................... | 174/255 |
| 7,676,919 B2 * | 3/2010 | Zhao et al. | ...................... | 29/852 |
| 7,705,246 B1 * | 4/2010 | Pritchard et al. | ............. | 174/262 |
| 7,709,747 B2 * | 5/2010 | Morlion et al. | ................ | 174/262 |
| 7,935,896 B2 * | 5/2011 | Morlion et al. | ............... | 174/262 |
| 2006/0091545 A1 * | 5/2006 | Casher et al. | ................. | 257/738 |
| 2006/0266549 A1 * | 11/2006 | Lin et al. | ....................... | 174/262 |

* cited by examiner

*Primary Examiner* — Michail V Datskovskiy
(74) *Attorney, Agent, or Firm* — Altis Law Group, Inc.

(57) ABSTRACT

A printed circuit board includes a first signal via, a second signal via, and a first ground via. A distance between the first ground via and the first signal via is substantially equal to a distance between the first ground via and the second signal via.

15 Claims, 5 Drawing Sheets

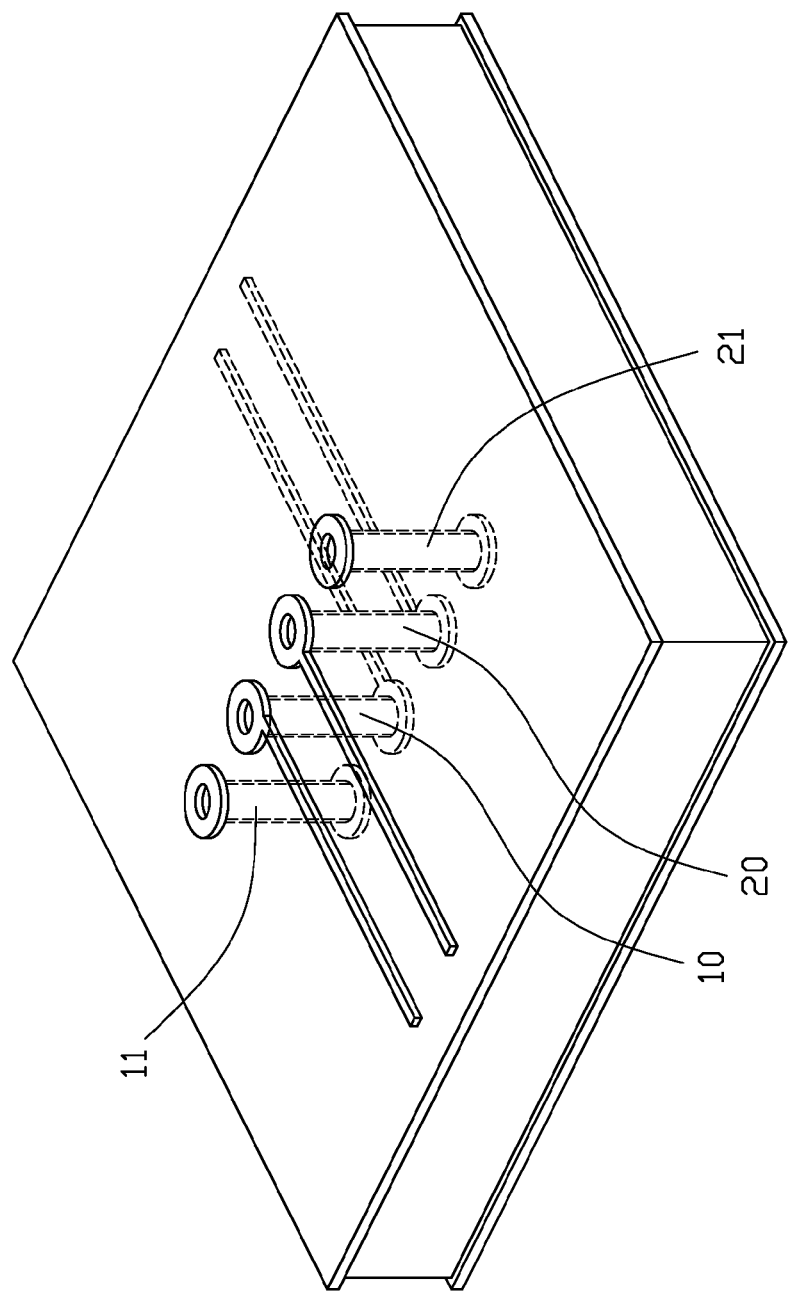
FIG. 5 <PRIOR ART>

PRINTED CIRCUIT BOARD

BACKGROUND

1. Technical Field

The present invention relates to a PCB with ground vias.

2. Description of Related Art

A typical printed circuit board (hereinafter referred to as PCB) is designed to connect various electronic components to each other along a predetermined pattern. FIG. 5 is a schematic view of a typical PCB defining two signal vias 10, 20 and two ground vias 11, 21 adjacent to the signal vias. The distance between the ground via 11 and the signal via 10 is substantially equal to the distance between the ground via 21 and the signal via 20. The typical PCB requires a ground via to be positioned next to each signal via, which occupies space in the PCB and increases material and fabrication cost for the additional ground vias. The typical PCB also produces a high signal reflection loss and a low signal insert loss.

Therefore, a low cost and space-saving PCB, which can decrease signal reflection loss and increase signal insert loss is desired to overcome the above-described shortcomings.

SUMMARY

A printed circuit board includes a first signal via, a second signal via, and a first ground via. A distance between the first ground via and the first signal via is substantially equal to a distance between the first ground via and the second signal via.

Other advantages and novel features will be drawn from the following detailed description of embodiments with attached drawings, in which:

BRIEF DESCRIPTION OF THE DRAWINGS

FIG. 5 is a schematic view of the typical PCB.

DETAILED DESCRIPTION OF THE EMBODIMENTS

Figure 1:
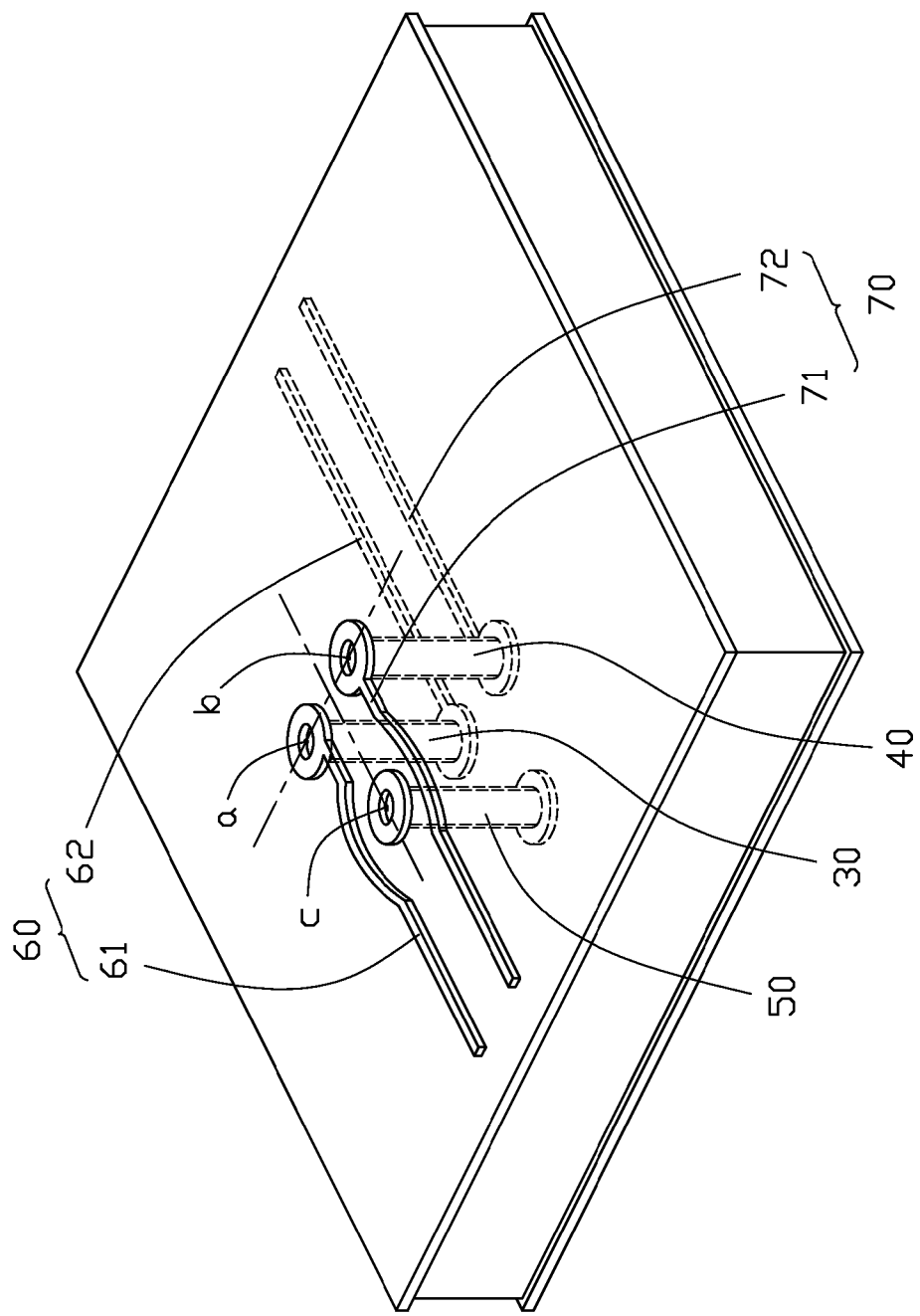
FIG. 1 is a schematic, isometric view of a first embodiment of a PCB.

Referring to FIG. 1, a first embodiment of a PCB (not labeled) includes two signal vias 30, 40, a ground via 50, and two differential traces 60, 70. The centerlines of the vias 30, 40, 50 are respectively defined as a, b, and c. The ground via 50 is positioned on one side of a line ab, which connects to centerlines a and b. A distance between the centerlines a and c is substantially equal to a distance between the centerlines b and c. Each of the vias 30, 40, 50 includes an upper cap (not labeled) positioned on a top layer of the PCB and a lower cap (not labeled) positioned on a bottom layer of the PCB. The differential trace 60 includes two segments 61, 62, and the differential trace 70 includes two segments 71, 72. The segments 61, 71 are positioned on the top layer of the PCB and respectively coupled to the upper caps of the signal vias 30, 40. The segments 62, 72 are positioned on the bottom layer of the PCB and respectively coupled to the lower caps of the signal vias 30, 40. A distance between the centerline c and the segment 61 is substantially equal to the distance between the centerline c and the segment 71.

Figure 2:
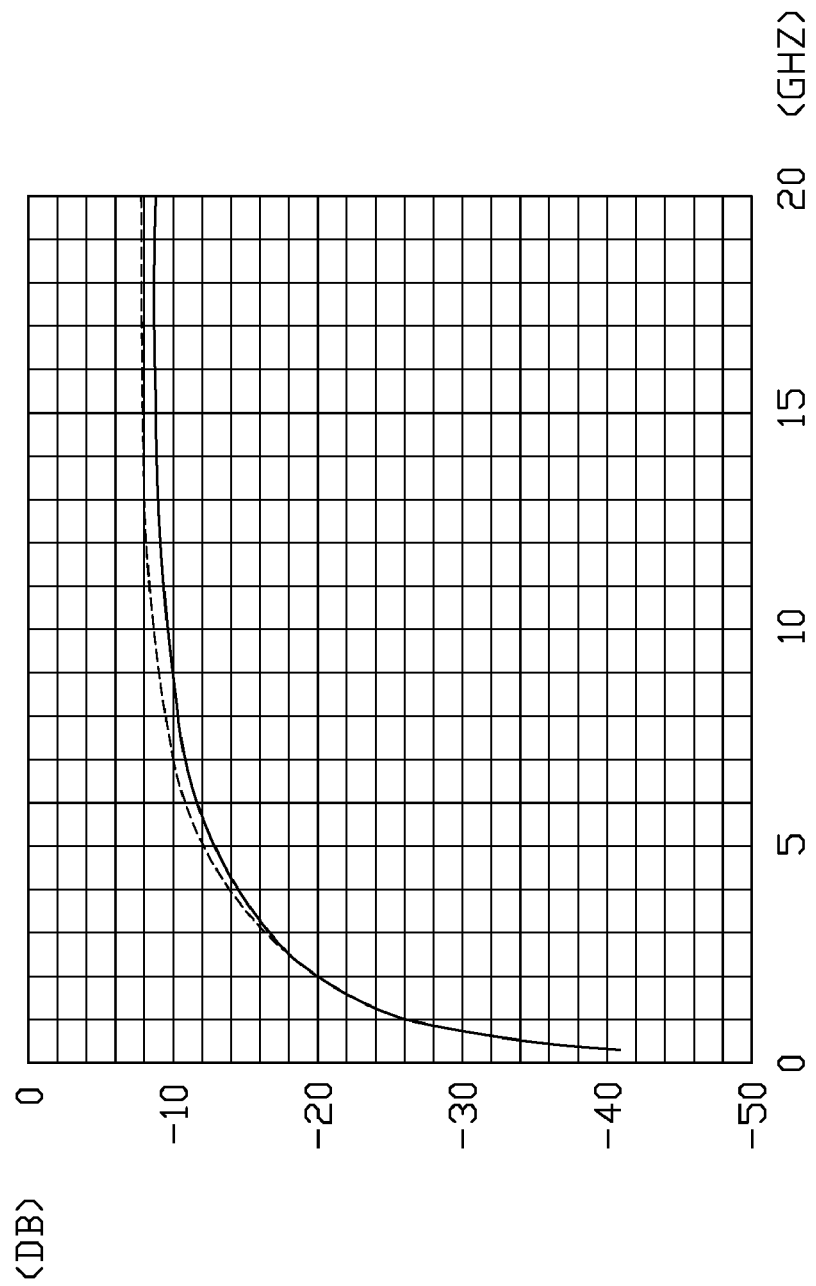
FIG. 2 is a graph showing an S parameter expressing a signal reflection loss in the PCB of FIG. 1 and a typical PCB.

Referring to FIG. 2, the broken line and solid line respectively show S parameters expressing signal reflection loss in the embodiment of FIG. 1 and the typical PCB. The graph shows that the signal reflection loss in the embodiment of FIG. 1 is lower than the signal reflection loss in the typical PCB as the signal frequency increases.

Figure 3:
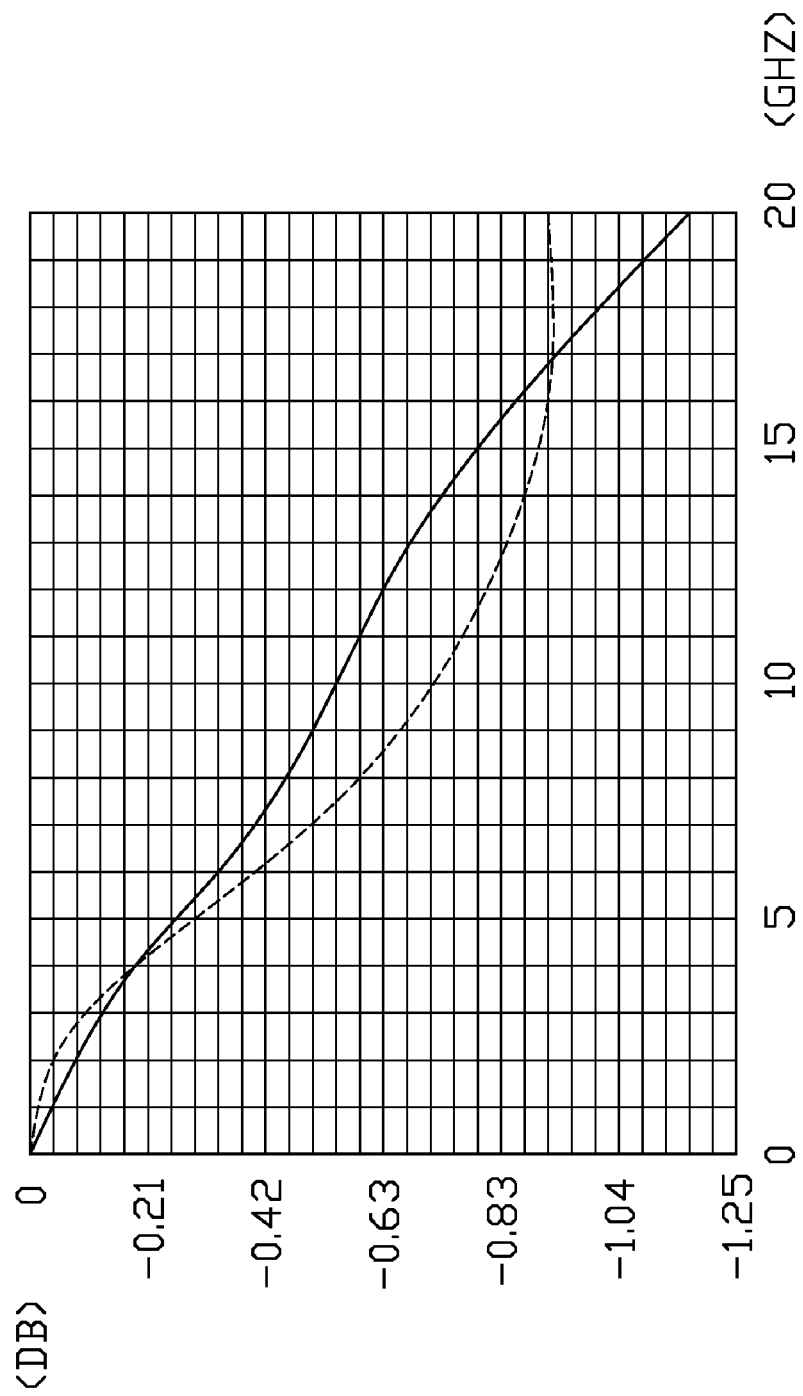
FIG. 3 is a graph showing an S parameter expressing a signal insert loss in the PCB of FIG. 1 and the typical PCB.

Referring to FIG. 3, the broken line and solid line respectively show S parameters expressing signal insert loss in the embodiment of FIG. 1 and the typical PCB. The graph shows that the signal insert loss in the embodiment of FIG. 1 is higher than the signal insert loss in the typical PCB when the signal frequency is between 4 GHZ and 17 GHZ. The first embodiment has less signal reflection loss and more signal insert loss than the typical PCB. In addition, only one ground via is needed, so space in the PCB is increased and the overall cost and weight of the PCB are decreased.

Figure 4:
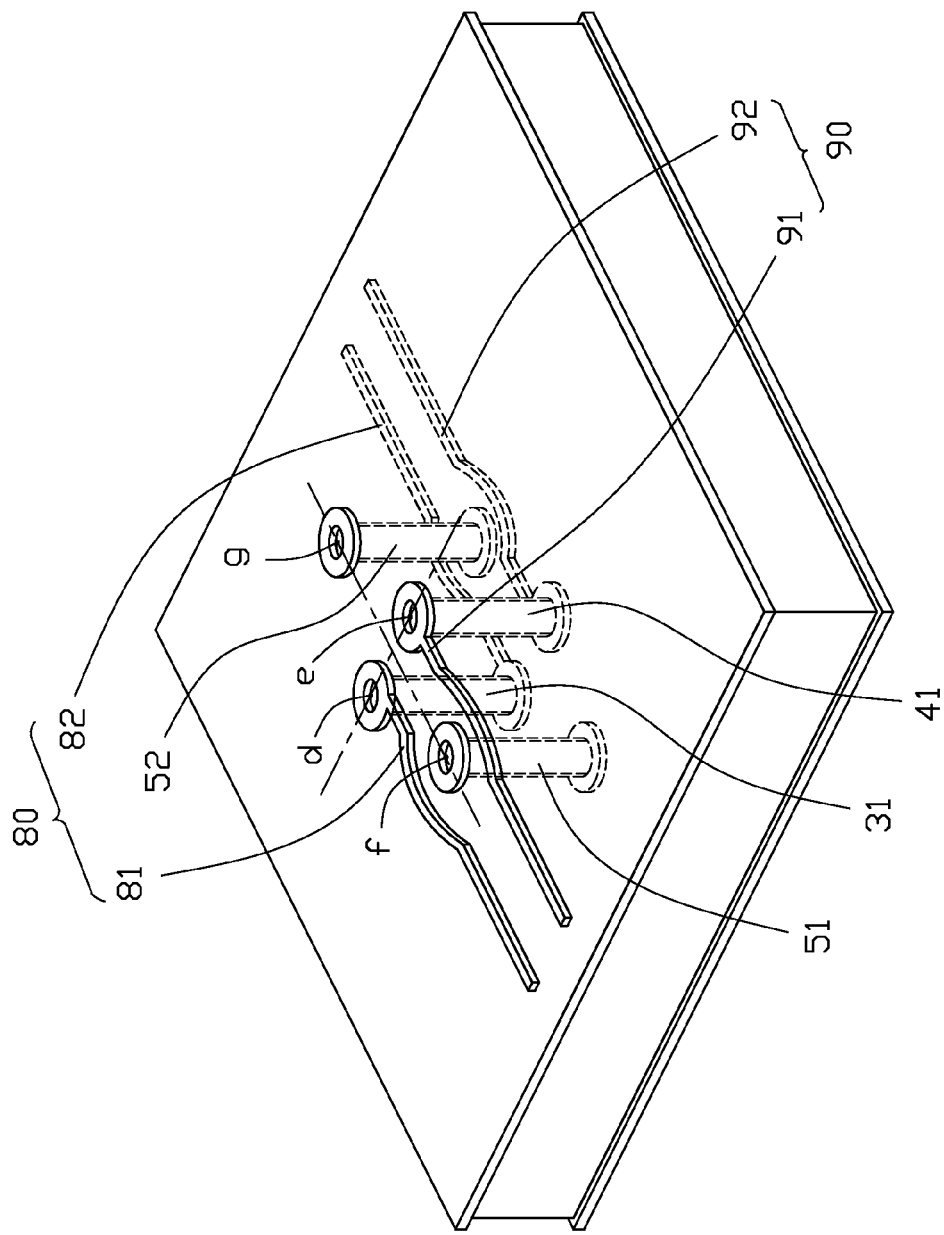
FIG. 4 is a schematic, isometric view of a second embodiment of a PCB.

Referring to FIG. 4, a second embodiment of a PCB includes two signal vias 31, 41, two ground vias 51, 52, and two differential traces 80, 90. The centerlines of the vias 31, 41, 51, 52 are respectively defined as d, e, f, and g. The ground via 51 is positioned on one side of a line de, which connects to centerlines d and e. A distance between the centerlines d and f is substantially equal to a distance between the centerlines e and f. The ground via 52 is positioned on the other side of the line de. A distance between the centerlines d and g is substantially equal to a distance between the centerlines e and g. A distance between the centerline f and the line de is substantially equal to a distance between the centerline g and the line de. Each of the vias 31, 41, 51, 52 includes an upper cap (not labeled) positioned on a top layer of the PCB, and a lower cap (not labeled) positioned on a bottom layer of the PCB. The differential trace 80 includes two segments 81, 82, and the differential trace 90 includes two segments 91, 92. The segments 81, 91 are positioned on the top layer of the PCB and respectively coupled to the upper caps of the signal vias 31, 41. The segments 82, 92 are positioned on the bottom layer of the PCB and respectively coupled to the lower caps of the signal vias 31, 41. A distance between the centerline f and the segment 81 is substantially equal to a distance between the centerline c and the segment 91. A distance between the centerline g and the segment 82 is substantially equal to a distance between the centerline c and the segment 92. In the second embodiment, the signal reflection loss should be further decreased and the signal insert loss should be further increased.

It is to be understood, however, that even though numerous characteristics and advantages of the present embodiments have been set forth in the foregoing description, together with details of the structure and function of the invention, the disclosure is illustrative only, and changes may be made in detail, especially in matters of shape, size, and arrangement of parts within the principles of the embodiments to the full extent indicated by the broad general meaning of the terms in which the appended claims are expressed.

What is claimed is:

1. A printed circuit board (PCB), comprising:
   a first signal via;
   a second signal via;
   a first ground via;
   a second ground via;
   a first differential trace comprising a first segment and a second segment; and
   a second differential trace comprising a third segment and a fourth segment;

wherein a distance between the first ground via and the first signal via is substantially equal to a distance between the first ground via and the second signal via; a distance between the second ground via and the first signal via is substantially equal to a distance between the second ground via and the second signal via; the first ground via and the second ground via each comprises an upper cap positioned on a top layer of the PCB, and a lower cap positioned on a bottom layer of the PCB; the upper cap of the first ground via is positioned between the first and third segments; and the lower cap of the second ground via is positioned between the second and fourth segments.

2. The PCB of claim 1, wherein the distance between the first ground via and the first signal via is substantially equal to the distance between the second ground via and the first signal via.

3. The PCB of claim 2, wherein the first signal via and the second signal via each comprise an upper cap positioned on a top layer of the PCB, and a lower cap positioned on a bottom layer of the PCB.

4. The PCB of claim 3, wherein the first segment is coupled to the upper cap of the first signal via and the third segment is coupled to the upper cap of the second signal via; the second segment is coupled to the lower cap of the first signal via and the fourth segment is coupled to the lower cap of the second signal via.

5. The PCB of claim 4, wherein the first and third segments are positioned on the top layer of the PCB, the second and fourth segments are positioned on the bottom layer of the PCB.

6. The PCB of claim 1, wherein a distance between the first ground via and the first segment is substantially equal to a distance between the first ground via and the third segment.

7. The PCB of claim 1, wherein a distance between the second ground via and the second segment is substantially equal to a distance between the second ground via and the fourth segment.

8. A printed circuit board (PCB), comprising:
a first signal via;
a second signal via;
a first ground via;
a first differential trace comprising a first segment and a second segment; and
a second differential trace comprising a third segment and a fourth segment;
wherein a distance between the first ground via and the first signal via is substantially equal to a distance between the first ground via and the second signal via; the first ground via comprises an upper cap positioned on a top layer of the PCB, and a lower cap positioned on a bottom layer of the PCB; and the upper cap of the first ground via is positioned between the first and third segments.

9. The PCB of claim 8, wherein the first signal via and the second signal via each comprises an upper cap positioned on a top layer of the PCB, and a lower cap positioned on a bottom layer of the PCB.

10. The PCB of claim 9, wherein the first segment is coupled to the upper cap of the first signal via and the third segment is coupled to the upper cap of the second signal via; the second segment is coupled to the lower cap of the first signal via and the fourth segment is coupled to the lower cap of the second signal via.

11. The PCB of claim 10, wherein the first and third segments are positioned on the top layer of the PCB; the second and fourth segments are positioned on the bottom layer of the PCB.

12. The PCB of claim 11, wherein the upper cap of the first ground via is positioned between the first and third segments.

13. The PCB of claim 12, wherein a distance between the first ground via and the first segment is substantially equal to a distance between the first ground via and the third segment.

14. The PCB of claim 8, further comprising a second ground via having an upper cap positioned on a top layer of the PCB, and a lower cap positioned on a bottom layer of the PCB; and the lower cap of the second ground via is positioned between the second and fourth segments.

15. The PCB of claim 14, wherein a distance between the second ground via and the second segment is substantially equal to a distance between the second ground via and the fourth segment.

* * * * *